US011699393B2

(12) United States Patent
Momose et al.

(10) Patent No.: US 11,699,393 B2
(45) Date of Patent: *Jul. 11, 2023

(54) CIRCUIT DEVICE, ELECTRO-OPTICAL ELEMENT, AND ELECTRONIC APPARATUS

(71) Applicant: SEIKO EPSON CORPORATION, Tokyo (JP)

(72) Inventors: Yoichi Momose, Matsumoto (JP); Mitsutoshi Miyasaka, Suwa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/870,334

(22) Filed: Jul. 21, 2022

(65) Prior Publication Data

US 2022/0358882 A1 Nov. 10, 2022

Related U.S. Application Data

(63) Continuation of application No. 17/360,591, filed on Jun. 28, 2021, now Pat. No. 11,417,275.

(30) Foreign Application Priority Data

Jun. 29, 2020 (JP) ............................ JP2020-111369

(51) Int. Cl.
*G09G 3/3233* (2016.01)
*G09G 3/20* (2006.01)
*H10K 50/80* (2023.01)

(52) U.S. Cl.
CPC ......... *G09G 3/3233* (2013.01); *G09G 3/2003* (2013.01); *H10K 50/80* (2023.02); *G09G 2300/0842* (2013.01); *G09G 2320/0666* (2013.01)

(58) Field of Classification Search
CPC ............... G09G 3/2003; G09G 3/3233; G09G 2300/0842; G09G 2320/0666; H01L 51/52
See application file for complete search history.

(56) References Cited

U.S. PATENT DOCUMENTS 11,417,275 B2 * 8/2022 Momose ............. G09G 3/2003
2002/0093472 A1 7/2002 Numao
2004/0056605 A1 3/2004 Yoshida
2004/0233143 A1 11/2004 Kasai
2005/0231450 A1 10/2005 Takai
2013/0201172 A1 8/2013 Jeong et al.
2013/0328753 A1 12/2013 Tsuge
(Continued)

FOREIGN PATENT DOCUMENTS

JP 2002-169510 A 6/2002
JP 2002-287718 A 10/2002
(Continued)

OTHER PUBLICATIONS

Mar. 1, 2022 Office Action Issued In U.S. Appl. No. 17/360,521.

*Primary Examiner* — Stacy Khoo

(57) ABSTRACT

A circuit device includes a scan line drive circuit that drives a plurality of scan lines of an electro-optical element. A field for constituting one image includes a plurality of subfields. The scan line drive circuit selects once a scan line group to be selected among the plurality of scan lines, in a subfield included in the plurality of subfields. The scan line group includes a scan line connected to a pixel circuit to which an i-th bit is written in a subfield, and a scan line connected to a pixel circuit to which a j-th bit is written in a subfield.

14 Claims, 13 Drawing Sheets

(56) References Cited

U.S. PATENT DOCUMENTS

| | | | | |
|---|---|---|---|---|
| 2015/0302795 | A1 | 10/2015 | Genoe | |
| 2016/0351121 | A1 | 12/2016 | Kim et al. | |
| 2017/0061878 | A1 | 3/2017 | Park et al. | |
| 2019/0130838 | A1* | 5/2019 | Miyasaka | G09G 3/3258 |
| 2019/0235250 | A1 | 8/2019 | Miyasaka et al. | |
| 2021/0407382 | A1 | 12/2021 | Momose et al. | |

FOREIGN PATENT DOCUMENTS

| | | | |
|---|---|---|---|
| JP | 2004-117648 | A | 4/2004 |
| JP | 2005-301174 | A | 10/2005 |
| JP | 2008-281827 | A | 11/2008 |
| JP | 2016-500850 | A | 1/2016 |
| JP | 2019-132941 | A | 8/2019 |
| WO | 2013/021622 | A1 | 2/2013 |

* cited by examiner

CIRCUIT DEVICE, ELECTRO-OPTICAL ELEMENT, AND ELECTRONIC APPARATUS

CROSS-REFERENCE TO RELATED APPLICATION(S)

This application is a continuation of U.S. application Ser. No. 17/360,591 filed Jun. 28, 2021, which is based on and claims priority under 35 U.S.C. 119 from Japanese Patent Application No. 2020-111369 filed on Jun. 29, 2020. The contents of the above applications are incorporated herein by reference.

BACKGROUND

1. Technical Field

The present disclosure relates to a circuit device, an electro-optical element, an electronic apparatus, and the like.

2. Related Art

JP 2019-132941 A and JP 2008-281827 A disclose a technique in which, in a display device using a light emitting element in a pixel, a pixel is caused to emit light by a time weighted in accordance with each bit of display data to perform grey-scale display as a time average. Additionally, J P 2019-132941 A and JP 2008-281827 A disclose a technique in which, while a plurality of scan lines are selected in order one by one from above, a first bit is written to a pixel connected to each scan line, next, similarly while a plurality of scan lines are selected in order one by one from above, a second bit is written to a pixel connected to each scan line, and these are continued until an MSB.

In JP 2019-132941 A and JP 2008-281827 A described above, a period occurs in which, while a plurality of scan lines are selected in order one by one from above, from writing a certain bit to a pixel connected to each scan line, to starting of writing a next bit, no scan line is selected. Since a length of one frame is determined by a frame rate, there is a problem in that a scan line drive frequency increases due to presence of a period in which no scan line is selected.

SUMMARY

An aspect of the present disclosure relates to a circuit device used for an electro-optical element including a plurality of scan lines, a plurality of pixel circuits respectively corresponding to one of the plurality of scan lines, a plurality of pixels respectively corresponding to one of the plurality of pixel circuits, the electro-optical element displaying a single image in a field, the circuit device comprising, a scan line drive circuit configured to output a selection signal to each of the plurality of scan lines, wherein the field includes first to n-th scan line selection periods in which first to n-th bits of display data are supplied to a pixel circuit included in the plurality of pixel circuits, n being an integer of 2 or greater, and first to n-th display periods in which a pixel of the plurality of pixels connected to the pixel circuit is ON-state or OFF-state, based on the first to n-th bits supplied to the pixel circuit, the field includes a plurality of subfields, the scan line drive circuit, in a subfield included in the plurality of subfields, selects once a scan line group to be selected among the plurality of scan lines, the scan line group includes a scan line connected to a pixel circuit to which an i-th bit of the first to n-th bits of the display data is supplied in the subfield, i being an integer from 1 to n, and a scan line connected to a pixel circuit to which a j-th bit of the first to n-th bits of the display data is supplied in the subfield, j being an integer from 1 to n and different from i.ON-state or OFF-state Another aspect of the present disclosure relates to an electro-optical element including the circuit device described in any of the above. the plurality of scan lines, the plurality of pixels, and the plurality of pixel circuits.

In addition, still another aspect of the present disclosure relates to an electro-optical element that includes a plurality of scan lines, a data line, a plurality of pixel portions arranged corresponding to respective intersections of the plurality of scan lines and the data line, and a scan line drive circuit configured to drive the plurality of scan lines, wherein each pixel portion of the plurality of pixel portions includes a pixel circuit that holds display data constituted by first to n-th bits bit by bit in a predetermined order, n being an integer of 2 or greater, and a pixel that is ON-state or OFF-state based on the held display data, the scan line drive circuit selects once, in each subfield included in a plurality of subfields, a scan line group to be selected among the plurality of scan lines, and the scan line group includes in the subfield, a scan line corresponding to a pixel circuit to which display data of an i-th bit is supplied, i being an integer from 1 to n, and a scan line corresponding to a pixel circuit to which display data of a j-th bit is supplied, j being an integer from 1 to n and different from i.

A further another aspect of the disclosure relates to an electronic apparatus including the circuit device described in any of the above, and the electro-optical element.

DESCRIPTION OF EXEMPLARY EMBODIMENTS

Exemplary embodiments of the present disclosure will be described in detail hereinafter. Note that, the present exemplary embodiment described hereinafter is not intended to unjustly limit the content as set forth in the claims, and all of the configurations described in the exemplary embodiment are not always essential requirements.

1. About Non-Display Period in Technique in the Past

Figure 1:
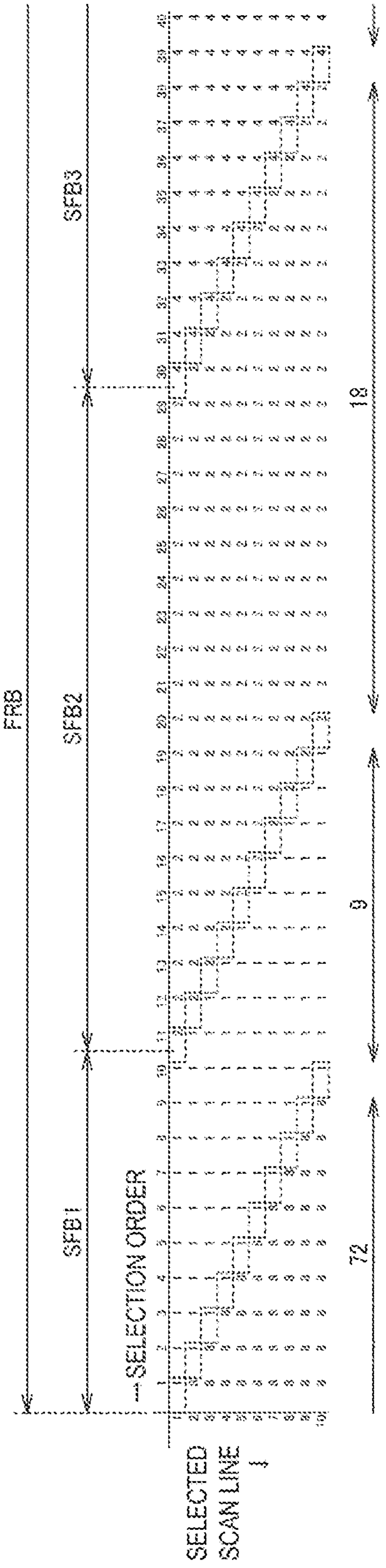
FIG. 1 is a diagram explaining a technique in the past for display control.

FIG. 1 is a diagram explaining a technique in the past for display control. Here, 16grey-scale display is performed using 4-bit display data, and the number of scan lines is 10. From an LSB side of the display data, first to fourth bits are aligned. A horizontal axis of a table in FIG. 1 indicates a selection order, and one selection in the selection order corresponds to a selection of one scan line. A vertical axis of the table indicates numbers of respective scan lines, and the numbers are assigned as 1 to 10 in order in a vertical scanning direction. The number listed in each box in the table indicates a grey-scale value of each bit of the display data. That is, 1, 2, 4, and 8 mean a first bit, a second bit, a third bit, and a fourth bit respectively. In addition, a number surrounded by a dotted line means that a bit corresponding to that number is written to a pixel circuit connected to a selected scan line.

First, operation when focusing on one scan line will be described using a first scan line as an example. In a selection order 1, the first scan line is selected, and a first bit is written to a pixel circuit connected to the first scan line. In subsequent selection orders 2 to 10, a light emitting element of a pixel does or does not emit light based on the first bit held in the pixel circuit. When the first bit is "1", the light emitting element emits light, and when the first bit is "0", the light emitting element does not emit light. Similarly, the first scan line is selected in selection orders 11, 30, and 67, and a second bit, a third bit, and a fourth bit are written to the pixel circuit connected to the first scan line. In subsequent selection orders 12 to 29, 31 to 66, 68 to 139, the light emitting element of the pixel does or does not emit light based on the second bit, the third bit, and the fourth bit held in the pixel circuit.

A period in which a light emitting element of a pixel does or does not emit light will be referred to as a display period. There are first to fourth display periods corresponding to the first to fourth bits. A period for one selection order is a period in which one scan line is selected. Hereinafter, this period is referred to as a scan line selection period, and a length of the period is h. The first to fourth display periods are 9 h, 18 h, 36 h, and 72 h respectively, and are weighted according to grey-scale values of the bits. Since a grey-scale value of an i-th bit is $2^{i-1}$, a display period is weighted with $2^{i-1}$. As a result, when viewed as a time average, a pixel emits light at brightness corresponding to the grey-scale value. Note that, when display data contains n bits, i is from 1 to n, and n=4 here.

Next, operation when 10 scan lines are scanned will be described. An FRB is a field, and one field constitutes one frame. That is, the field FRB is a period for causing one image to be displayed, and is a period required to write display data corresponding to one image to all pixels. The field FRB includes a subfields SFB1 to SFB4 corresponding to first to fourth bits of display data.

In selection orders 1 to 10 for the subfield SFB1, first to 10th scan lines are sequentially selected, and the first bit is written to a pixel circuit connected to each scan line. Next, in selection orders 11 to 20 for the subfield SFB2, the first to 10th scan lines are sequentially selected, and the second bit is written to the pixel circuit connected to each scan line. In selection orders 21 to 29 for the subfield SFB2, no scan line is selected. Next, in selection orders 30 to 39 for the subfield SFB3, the first to 10th scan lines are sequentially selected, and the third bit is written to the pixel circuit connected to each scan line. In selection orders 40 to 66 for the subfield SFB3, no scan line is selected. Next, in selection orders 67 to 76 for the subfield SFB4, the first to 10th scan lines are sequentially selected, and the fourth bit is written to the pixel circuit connected to each scan line. In selection orders 77 to 139 for the subfield SFB4, no scan line is selected.

Figure 2:
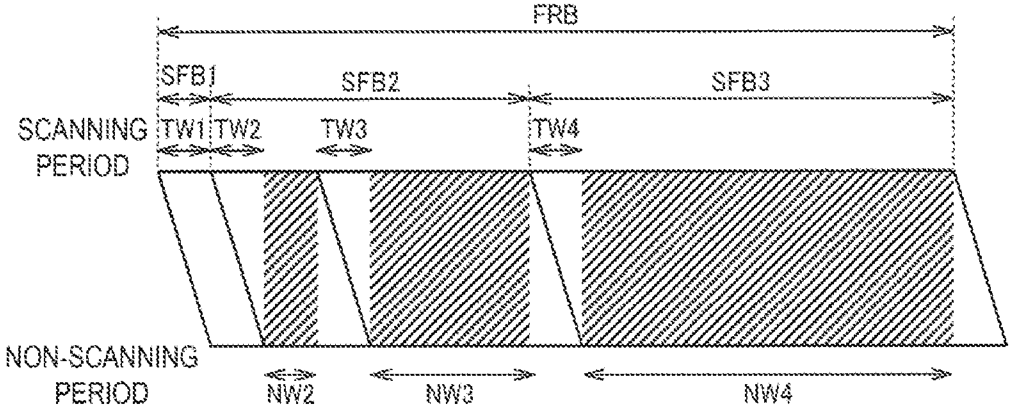
FIG. 2 is a diagram schematically illustrating operation of the technique in the past.

FIG. 2 is a diagram schematically illustrating the operation of FIG. 1. The subfield SFB1 is the same as a scanning period TW1 for scanning scan lines for one screen. The subfield SFB2 includes a scanning period TW2 and a non-scanning period NW2 in which no scan line is scanned. The subfield SFB3 includes a scanning period TW3 and a non-scanning period NW3, and the subfield SFB4 includes a scanning period TW4 and a non-scanning period NW4.

When the total number of scan lines for one screen is k, a length of each of the scanning periods TW1 to TW4 is kh. When k is a number sufficiently greater than the number of bits of 4, lengths of the subfields SFB2, SFW3, and SFB4 can be approximated as 2 kh, 4 kh, and 8 kh respectively, and a length of the field FRB can be approximated as (1+2+4+8)×kh=15 kh. At this time, a total scanning period is 4 kh, and a total non-scanning period is 11 kh, so respective ratios occupying in the field are 4/15 and 11/15.

In the above description, the display data contains four bits, but, for example, when the display data contains six bits, a ratio occupied by a scanning period in the field is 6/63, and a ratio occupied by a non-scanning period in the field is 57/63. Since a length of a field is determined by a frame frequency of display, the more the number of bits of display data, the shorter a scanning period of a scan line, and the shorter the length h of a scan line selection period in which one scan line is selected. Further, when the number of scan lines is increased, since a scanning period is shortened, and more scan lines are to be selected within the scanning period, the length h of a scan line selection period in which one scan line is selected is shortened.

As described above, since the non-scanning periods NW2 to NW4 are present in the field FRB in the technique in the past, there is a problem in that the length h of a scan line selection period is shortened, and a drive frequency of a scan line is raised. There is a problem in that, when the drive frequency of a scan line is raised, power consumption of scan line drive increases, or it becomes difficult to increase the number of scan lines or the number of grey scales.

Note that, accurately, respective lengths of the non-scanning periods NW2, NW3, and NW4 are (k−1)h, 3(k−1)h, and 7(k−1)h, and the length of the field FRB is 4 kh+11(k−1)h=(15(k−1)+4)h. When display data contains n bits, the length of the field FRB is $((2^n-1)\times(k-1)+n)h$. As an example, when 256grey-scale display is performed at a frame frequency of 60 Hz in full high vision, k=1080 and n=8. Accordingly, the length of the scan line selection period is $h=1/((2^8-1)\times(1080-1)+8)/60$ sec=0.06 µsec.

2. Circuit Device and Display System

Figure 3:
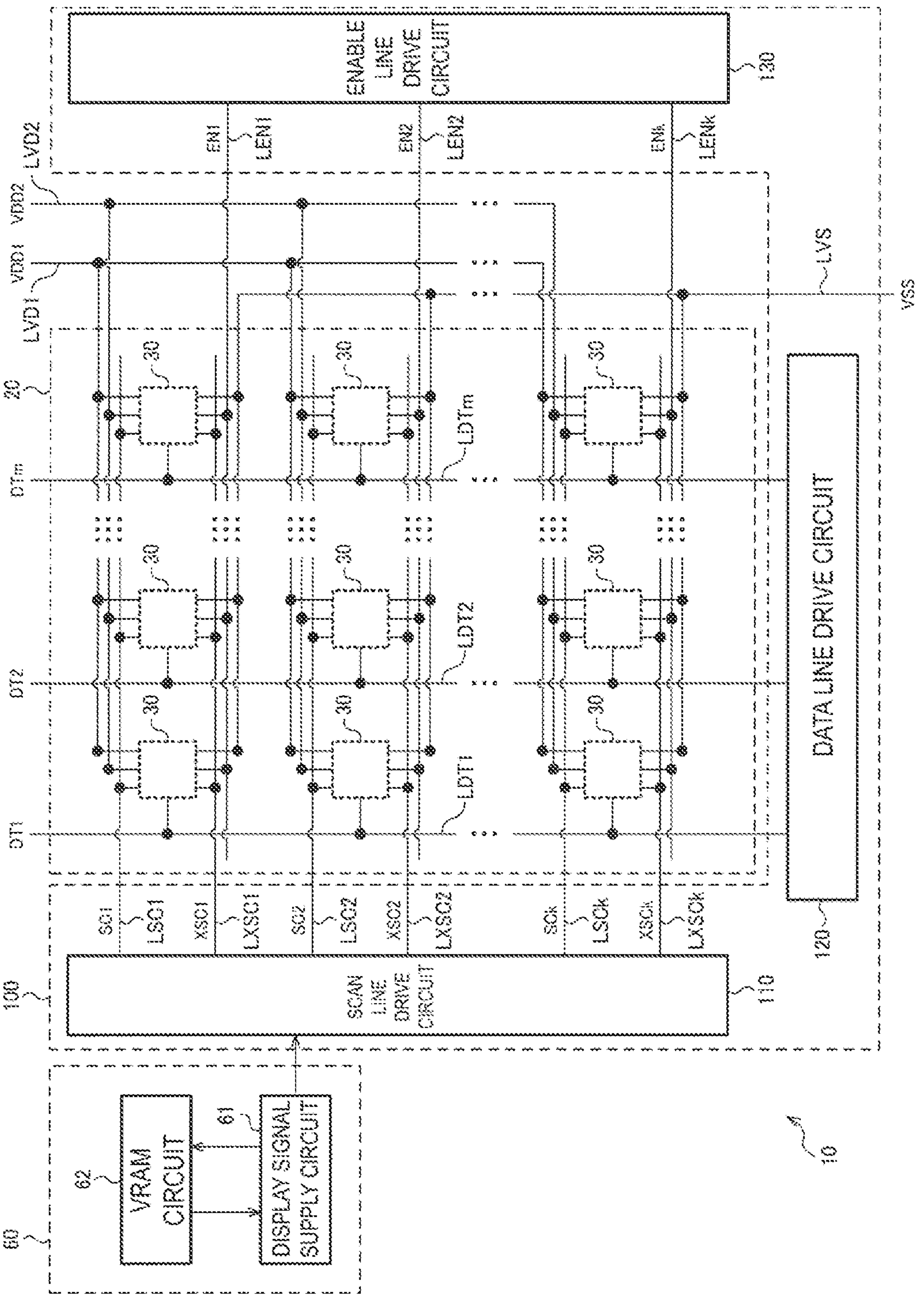
FIG. 3 is a configuration example of a circuit device according to the present exemplary embodiment, and a display system including the circuit device.

FIG. 3 is a configuration example of a circuit device 100 according to the present exemplary embodiment, and a display system 10 including the circuit device 100. The display system 10 includes a display controller 60, the circuit device 100, and a pixel array 20.

The display controller 60 outputs display data to the circuit device 100, and performs display timing control. The display controller 60 includes a display signal supply circuit 61 and a VRAM circuit 62.

The VRAM circuit 62 stores display data to be displayed on the pixel array 20. For example, when storing image data for one image, the VRAM circuit 62 stores display data one at a time corresponding to each pixel of the pixel array 20.

The display signal supply circuit 61 generates a control signal for controlling display timing. The control signal is, for example, a vertical synchronization signal, a horizontal synchronization signal, a clock signal, or the like. The display signal supply circuit 61 reads display data from the VRAM circuit 62 in accordance with display timing, and outputs the display data and a control signal to the circuit device 100.

The circuit device 100 drives the pixel array 20 based on the display data and the control signal from the display controller 60 to cause the pixel array 20 to display an image. The circuit device 100 includes a scan line drive circuit 110, a data line drive circuit 120, and an enable line drive circuit 130.

The pixel array 20 is a pixel array of an electro-optical element, and includes a plurality of pixel portions 30 arranged in a matrix of k rows and m columns. k and m are each an integer equal to or greater than 2. The pixel portion 30 includes a pixel circuit and a pixel as described below. The pixel array 20 includes scan lines LSC1 to LSCk, inversion scan lines LXSC1 to LXSCk, enable data lines LEN1 to LENk, image data lines LDT1 to LDTm, power source lines LVD1, LVD2, and a ground line LVS.

The scan line LSC1, the inversion scan line LXSC1, and the enable data line LEN1 are connected to the pixel portions 30 in a first row. The scan line drive circuit 110 outputs a selection signal SC1 to the scan line LSC1, and outputs an inversion selection signal XSC1, which is a logic inversion signal of the selection signal SC1, to the inversion scan line LXSC1. The enable line drive circuit 130 outputs an enable signal EN1 to the enable data line LEN1. Similarly, the scan lines LSC2 to LSCk, the inversion scan lines LXSC2 to LXSCk, and the enable data lines LEN2 to LENk are connected to the pixel portions 30 in the second to k-th rows respectively. The scan line drive circuit 110 outputs selection signals SC2 to SCk to the scan lines LSC2 to LSCk respectively, and outputs inversion selection signals XSC2 to XSCk, which are the logic inversion signals of the selection signals SC2 to SCk respectively, to the inversion scan lines LXSC2 to LXSCk respectively. The enable line drive circuit 130 outputs enable signals EN2 to ENk to the enable data lines LEN2 to LENk respectively.

The image data line LDT1 is connected to the pixel portions 30 in the first row. The data line drive circuit 120 outputs an image signal DT1 to the image data line LDT1. The image signal DT1 is a signal of any one of n bits of display data. Similarly, the image data lines LDT2 to LDTm are connected to the pixel portions 30 in the second to m-th rows respectively. The data line drive circuit 120 outputs image signals DT2 to DTm to the image data lines LDT2 to LDTm respectively.

The power source lines LVD1, LVD2, and the ground line LVS are connected to all of the pixel portions 30. A first supply voltage VDD1 is supplied to the power source line LVD1 from a power supply circuit (not illustrated). A second supply voltage VDD2 is supplied to the power source line LVD2 from a power supply circuit (not illustrated). A ground voltage VSS is supplied to the ground line LVS from a power supply circuit (not illustrated). Note that, the power source lines LDV1 and LVD2 may be one common power source line, and a common power supply voltage may be supplied to the power source line.

Figure 4:
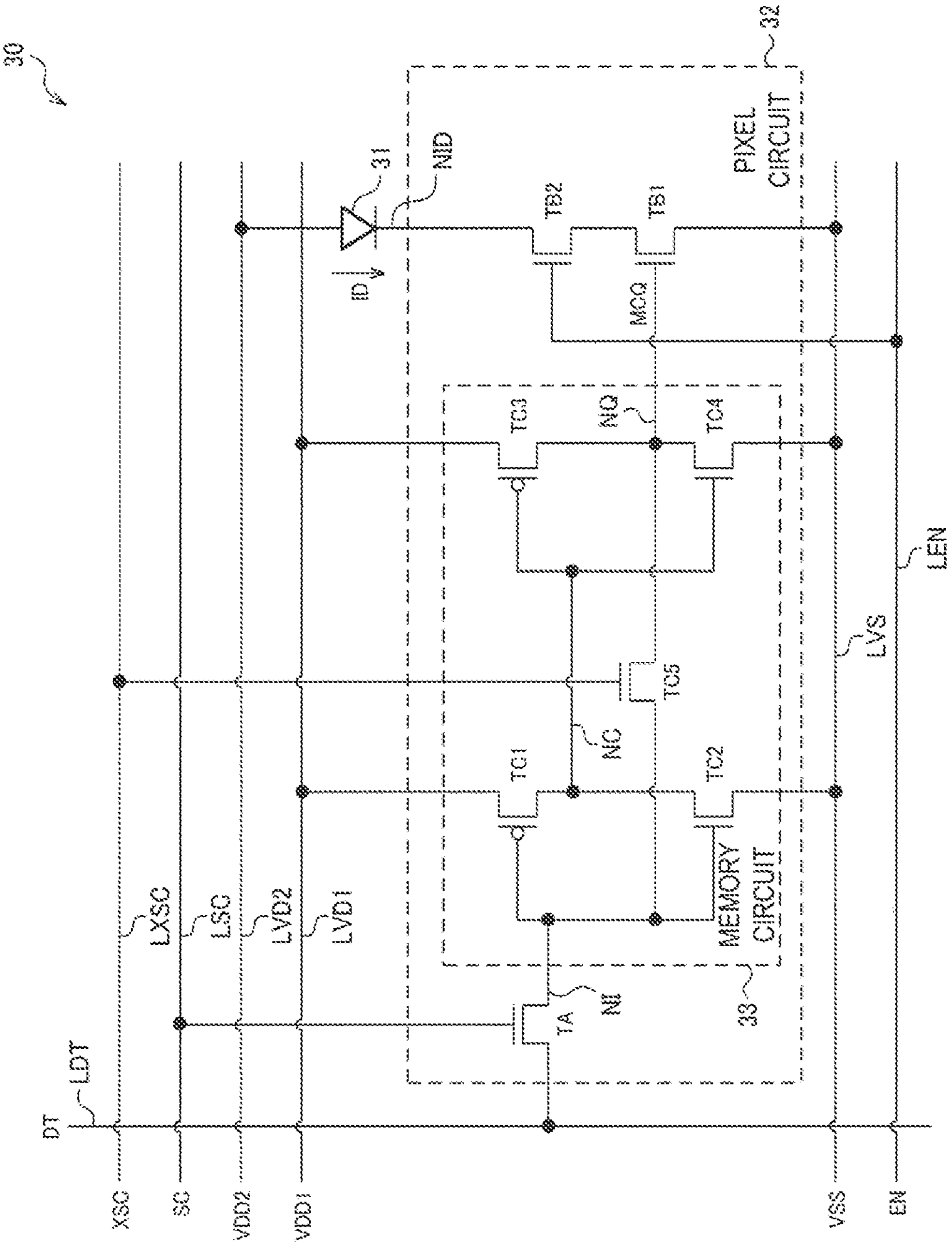
FIG. 4 is a configuration example of a pixel portion.

FIG. 4 is a configuration example of the pixel portion 30. The pixel portion 30 includes a pixel 31 and a pixel circuit 32. Note that in FIG. 4, 1 to k and 1 to m in the SC1 to SCk, DT1 to DTm, and the like are omitted. For example, SC is any one of SC1 to SCk.

The pixel 31 is a light emitting element. The light emitting element is, for example, an OLED, a micro LED, or the like. OLED is an abbreviation for Organic Light Emitting Diode, and LED is an abbreviation for Light Emitting Diode. Micro LEDs are inorganic LEDs integrated on a substrate. An anode of the light emitting element is connected to the power source line LVD2, and a cathode is connected to a pixel control node NID of the pixel circuit 32. The pixel 31 is controlled to be ON-state or OFF-state by the pixel circuit 32. Here, ON means that the light emitting element is in a light emitting state due to a current ID flowing to the light emitting element, and OFF means that the light emitting element is in a non-emitting state due to no current ID flowing to the light emitting element.

The pixel circuit 32 holds a bit of display data, which is an image signal DT, and controls the pixel 31 to be ON-state or OFF-state based on the image signal DT and an enable signal EN. The pixel circuit 32 includes a memory circuit 33 and N-type transistors TA, TB1, and TB2.

One of a source and a drain of the N-type transistor TA is connected to the image data line LDT, another of the source and the drain is connected to an input node NI of the memory circuit 33, and a gate is connected to a scan line LSC.

A source of the N-type transistor TB1 is connected to the ground line LVS, a drain is connected to a source of the N-type transistor TB2, and a gate is connected to an output node NQ of the memory circuit 33.

A drain of the N-type transistor TB2 is connected to the pixel control node NID of the pixel circuit 32, and a gate is connected to an enable data line LEN.

The memory circuit 33 is a memory cell that stores one bit of data. The memory circuit 33 stores the image signal DT inputted to the input node NI from the image data line LDT when the N-type transistor TA is ON-state, and outputs the stored signal to the output node NQ as an output signal MCQ. The memory circuit 33 includes P-type transistors TC1, TC3, N-type transistors TC2, TC4, and TC5. Note that, the N-type transistor TC5 may be constituted by a P-type transistor. In this case, it is possible to connect to the scan line LSC, and an inversion scan line LXSC can be omitted.

The P-type transistor TC1 and the N-type transistor TC2 constitute a first inverter, and the P-type transistor TC3 and the N-type transistor TC4 constitute a second inverter. A power supply voltage of the first inverter and the second inverter is VDD1. An input node of the first inverter is connected to the input node NI of the memory circuit 33, an output node NC of the first inverter is connected to an input node of the second inverter, and an output node of the second inverter is connected to the output node NQ of the memory circuit 33. One of a source and a drain of the N-type transistor TC5 is connected to the input node NI, and another of the source and the drain is connected to the output node NQ.

When "1" is written to the memory circuit 33, the output signal MCQ is at a high level, and when "0" is written, the output signal MCQ is at a low level. When the output signal MCQ of the memory circuit 33 and the enable signal EN are at the high level, the N-type transistors TB1 and TB2 are ON, the current ID flows to the pixel 31, and the pixel 31 emits light. When at least one of the output signal MCQ of the memory circuit 33 and the enable signal EN is at the low level, at least one of the N-type transistors TB1 and TB2 is OFF-state, the current ID does not flow to the pixel 31, and the pixel 31 does not emit light.

Note that, the configuration of FIG. 4 is an example of the pixel portion, and the technique of the present exemplary embodiment can be applied to pixel circuits and pixels of various configurations. For example, a capacitor may be provided in place of the memory circuit 33, and the capacitor may hold the image signal DT. Alternatively, the N-type transistor TC5 in the memory circuit 33 may be omitted, and the input node NI of the first inverter and the output node NQ of the second inverter may be directly connected. Alternatively, the power supply voltages VDD1 and VDD2 may be a common power supply voltage, and the common power supply voltage may be supplied to the pixel 31 and the memory circuit 33 with one power source line. Alternatively, the pixel is not limited to the light emitting element, and may be an element capable of turning light ON-state or OFF-state. For example, the pixel may be a DMD micromirror. DMD is an abbreviation of Digital Micromirror Device. In this case, the pixel circuit is a circuit that drives a movable part of the micromirror. Alternatively, the pixel may be a pixel in a reflective liquid crystal display element. In this case, the drive circuit is a circuit that drives a pixel of liquid crystal.

Figure 5:
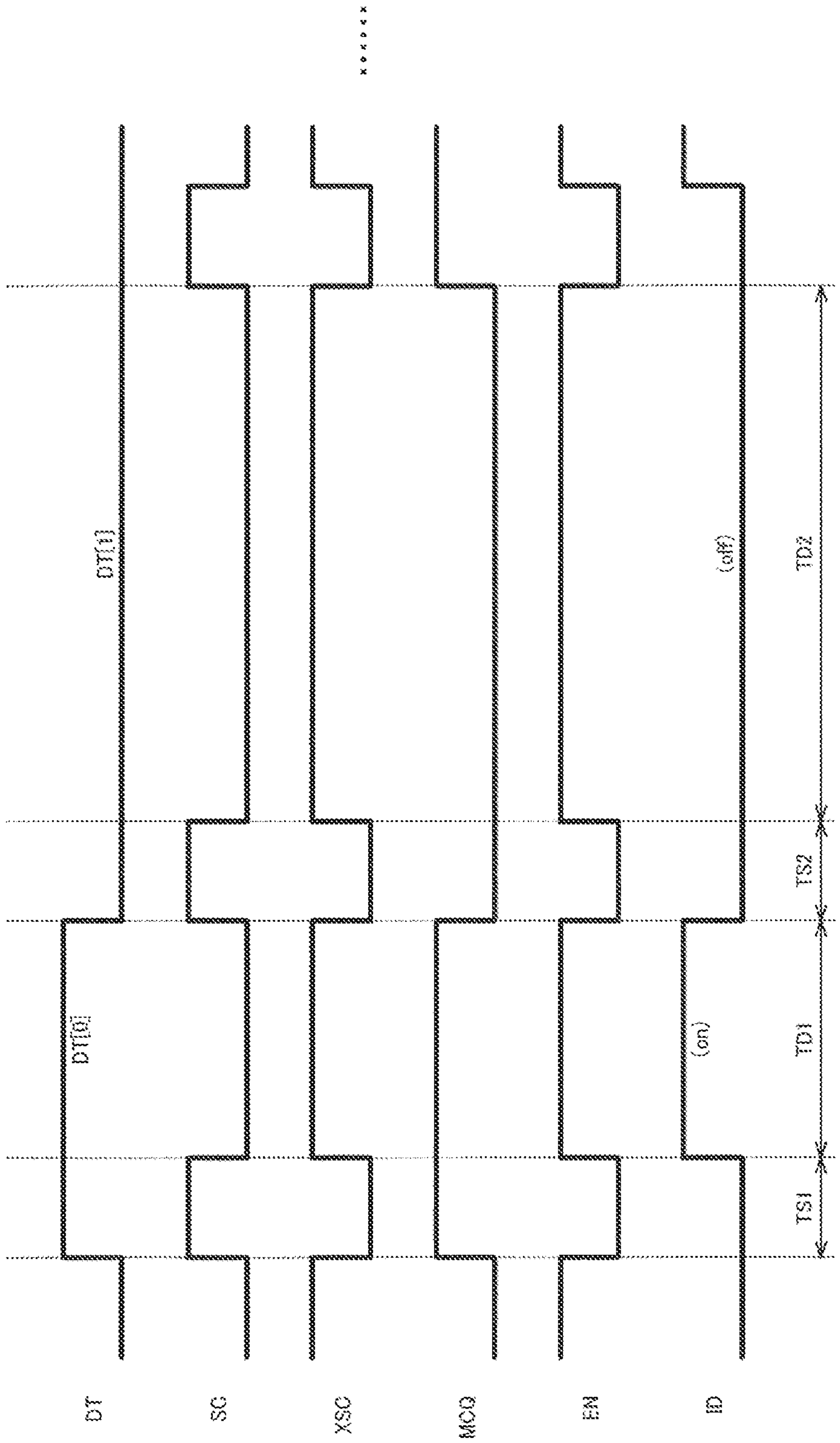
FIG. 5 is a timing chart for explaining operation of the pixel portion.

FIG. 5 is a timing chart for explaining operation of the pixel portion 30. In FIG. 5, a case will be described as an example in which a first bit of display data is DT[0]=1 and a second bit is DT[1]=0.

In a scan line selection period TS1, a selection signal SC is at a high level, and an inversion selection signal XSC is at a low level. The N-type transistor TA is ON-state, and the N-type transistor TC5 is OFF-state. As a result, the first bit DT[0]=1 is inputted to the memory circuit 33 as the image signal DT, and the memory circuit 33 outputs the output signal MCQ at the high level. The enable signal EN is at the low level, and the pixel 31 is OFF-state in the scan line selection period TS1.

In a display period TD1, the selection signal SC is at the low level, and the inversion selection signal XSC is at the high level. The N-type transistor TA is OFF-state, and the N-type transistor TC5 is ON-state. As a result, the memory circuit 33 holds the first bit DT[0]=1, and holds the output signal MCQ at the high level. The enable signal EN is at the high level, and the pixel 31 is ON-state in the display period TD1.

The pixel portion 30 operates in the same manner as described above also in a scan line selection period TS2 and a display period TD2, but the second bit DT[1]=0, and thus the pixel 31 is OFF-state in the display period TD2. A length of the display period TD2 is twice a length of the display period TD1, and the lengths of the display periods TD1 and TD2 are lengths proportional to grey-scale values 1 and 2 of the first bit and the second bit respectively.

3. First Example of Scan Line Selection Order

Figure 6:
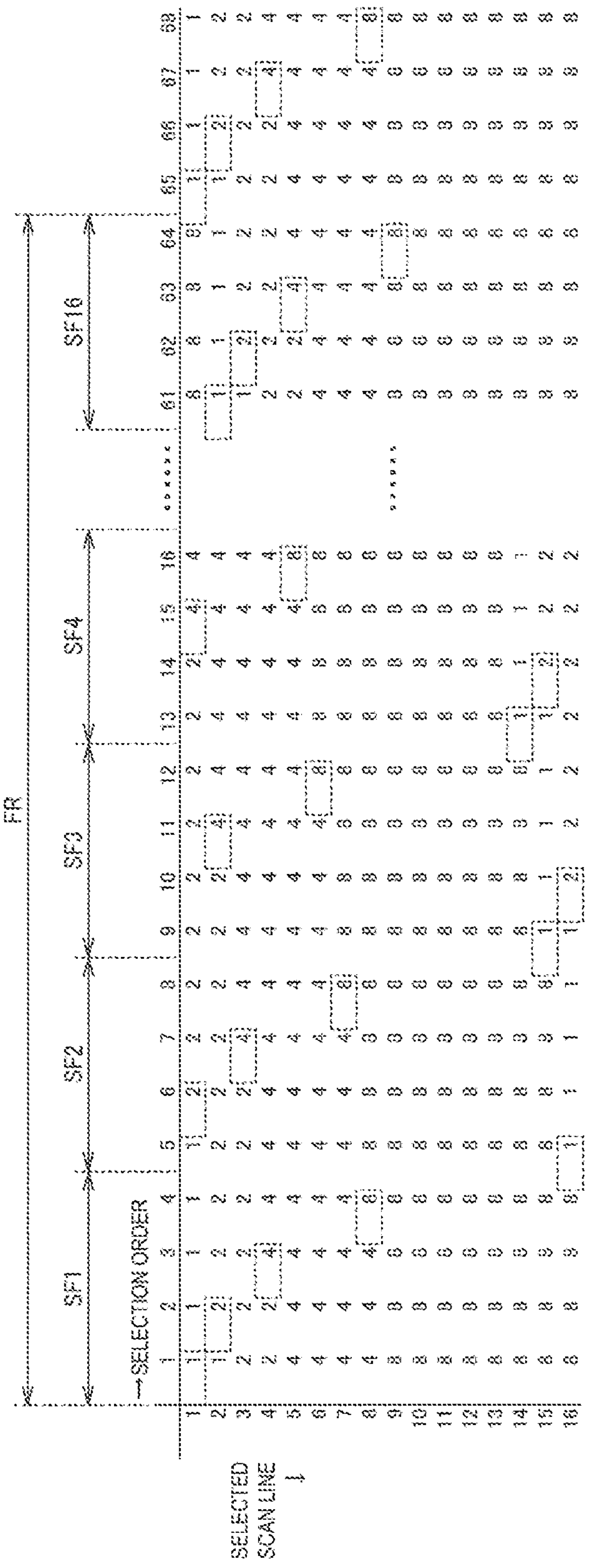
FIG. 6 is a first example of a scan line selection order.

FIG. 6 is a first example of a scan line selection order according to the present exemplary embodiment. Here, a case will be described as an example in which the total number of scan lines included in the pixel array 20 is k=16, and the number of bits of display data is n=4. From an LSB side of the display data, first to fourth bits are aligned. The way of viewing the table is similar to that for FIG. 1. Note that, in the following, "a bit is written to a pixel circuit connected to a scan line", as appropriate, is abbreviated as "a bit is written to a scan line".

First, operation when focusing on one scan line will be described using a first scan line as an example. In a selection order 1, a first scan line is selected, and a first bit is written to the first scan line. In subsequent selection orders 2 to 5, a pixel is ON-state or OFF-state based on the first bit held in a pixel circuit. Similarly, the first scan line is selected in selection orders 6, 15, 32, and, a second bit, a third bit, and a fourth bit are written to the first scan line. In subsequent selection orders 7 to 14, 16 to 31, 33 to 64, the pixel is ON-state or OFF-state based on the second bit, the third bit, and the fourth bit held in the pixel circuit.

In the above, first to fourth scan line selection periods and first to fourth display periods are provided corresponding to the first to fourth bits in one field respectively. In the first scan line, the first to fourth scan line selection periods are periods corresponding to the selection orders 1, 6, 15, and 32, respectively, and the first to fourth display periods are periods corresponding to the selection orders 2 to 5, 7 to 14, 16 to 31, and 33 to 64, respectively. Lengths of the first to fourth display periods are 4 h, 8 h, 16 h, 32 h respectively. Which selection order corresponds to the scan line selection period and the display period varies for each scan line, but the first to fourth scan line selection periods and the first to fourth display periods are similarly provided for each scan line.

Next, operation when 16 scan lines are scanned will be described. An FR is a field, and one field constitutes one frame. That is, the field FR is a period for constituting one image, and is a period required to write display data corresponding to one image to all pixels. Note that, the same field FR is defined for all scan lines based on selection orders in any one scan line. For example, in FIG. 6, the field FR is defined based on the selection orders in the first scan line. Thus, image data written to the pixel array 20 in the field FR does not become image data exactly corresponding to one image, but an amount of the image data corresponds to one image. In such a sense, the field FR is a period for constituting one image.

The field FR includes subfields SF1 to SF16 corresponding to the number of grey scales 16 of the display data. A length of each subfield is 4 h corresponding to the number of bits 4 of the display data, when a length of a scan line selection period is h.

The scan line drive circuit 110 selects a scan line group to be selected among the first to the 16th scan lines in each subfield. In FIG. 6, the scan line group includes four scan lines corresponding to the number of bits 4 of the display data. A first bit is written to a pixel circuit connected to one scan line of the four scan lines, a second bit is written to a pixel circuit connected to another scan line, a third bit is written to a pixel circuit connected to further another scan line, and a fourth bit is written to a pixel circuit connected to still another scan line. For example, in the subfield SF1, the first scan line, the second scan line, the fourth scan line, and the eighth scan line form a scan line group, and the first bit, the second bit, the third bit, and the fourth bit are written to pixel circuits connected thereto respectively.

The four scan lines belonging to the scan line group are selected in different selection orders respectively. In the subfield SF1 of FIG. 6, the first scan line, the second scan line, the fourth scan line, and the eighth scan line belonging to the scan line group are selected in the selection orders 1, 2, 3, and 4, respectively.

When the subfield is advanced by one, the number of the scan line belonging to the scan line group is decreased by one. In other words, a selection order pattern in the subfield moves by one scan line in an upward direction on a screen. This pattern movement of is performed cyclically. In other words, the selection order pattern of the first scan line in a certain subfield is a selection pattern of the 16th scan line in the next subfield. For example, in the subfield SF2, the 16th scan line, the first scan line, the third scan line, and the seventh scan line form a scan line group, and the first bit, the second bit, the third bit, and the fourth bit are written to pixel circuits connected thereto respectively. In this case, the selection order pattern in the subfield SF1 moves upward by one scan line in a cyclic manner.

In the subfield SF1, each of the first to fourth bits is written to scan line having a number corresponding to a grey-scale value of each bit. That is, since the grey-scale values of the first to fourth bits are 1, 2, 4, and 8 respectively, the first to fourth bits are written to the first scan line, the second scan line, the fourth scan line, and the eighth scan line respectively. Considering intervals of the scan lines, the second scan line is one line after the first scan line, the fourth scan line is two lines after the second scan line, and the eighth scan line is four lines after the fourth scan line. In the next subfield SF2, the first bit is written to the 16th scan line, but this is eight lines after the eighth scan line. As a result, the first to fourth display periods have lengths corresponding to the grey-scale values. Specifically, a description will be given focusing on a display period in the first scan line. First, the second bit is written to the second scan line in the selection order 2, but the selection order pattern moves to the first scan line after one subfield. Since the length of the subfield is 4 h, and the first display period of the first scan line starts from the selection order 2, the length of the first display period is 1×4 h. Next, the third bit is written to the third scan line in the selection order 7, but this selection order pattern moves to the first scan line after two subfields. Since the second display period of the first scan line starts from the selection order 7, a length of the second display period is 2×4 h=8 h. Similarly, a length of the third display period is 4×4 h, and a length of the fourth display period is 8×4 h.

Since the total number of scan lines is 16 that is the same as the number of grey scales, and writing 4 bits is required per scan line, the total number of scan line selections in one field is 16×4=64. In FIG. 6, one field is constituted by the selection orders 1 to 64, and the same selection order pattern as that selection order pattern is repeated in the selection orders 65 to 128 of the next field. A similar selection order pattern is repeated in each field in the selection order 129 and the later as well. Note that, when the display data contains n bits, the total number of scan line selections is expressed as $2^n \times n$.

The scan line drive circuit 110 selects the scan lines in the selection order pattern as described above, thus the selection orders in which no scan line is selected can be eliminated. In other words, the non-scanning periods NW2 to NW4 in the technique in the past illustrated in FIG. 2 are eliminated, so it is possible to lower the scan line drive frequency.

As an example, when 256grey-scale display is performed at a frame frequency of 60 Hz in full high vision, n=8. The number of scan lines is set to $5\times2^8=1280$ here. A method in which the number of scan lines is increased from $2^n$ will be described later, but the basic idea of the scan line selection order is the same as in the first example. The length of the scan line selection period is h=1/(1280×8)/60 sec=1.63 μsec. Since h=0.06 μsec in the technique in the past illustrated in FIG. 1 and FIG. 2, the scan line drive frequency can be greatly lowered according to the present exemplary embodiment.

According to the present exemplary embodiment, the scan line drive circuit 110 selects once the scan line group to be selected among the plurality of scan lines, in the subfield included in the plurality of subfields. The scan line group includes a scan line connected to a pixel circuit to which an i-th bit is written in a subfield, and a scan line connected to a pixel circuit to which a j-th bit is written in a subfield. i is an integer from 1 to n, and j is an integer from 1 to n and different from i.

In the technique in the past illustrated in FIG. 1, the same bit among the first to n-th bits is written to all the scan lines in one subfield. Thus, as described in FIG. 2, the non-scanning periods NW2 to NW4 are generated. On the other hand, according to the present exemplary embodiment, the i-th bit is written to one scan line in one subfield, and the j-th bit is written to another scan line. As a result, the non-scanning periods in which no scan line is selected can be reduced, and the scan line drive frequency can be lowered compared to the technique in the past. When the scan line drive frequency is lowered, it is possible to reduce power consumption in scan line drive, or to reliably write data to the pixel circuit. Alternatively, more scan lines can be selected in one frame, given the same scan line drive frequency as in the technique in the past. In other words, a higher definition electro-optical element can be driven without raising the scan line drive frequency compared to the technique in the past.

Here, the plurality of subfields are the subfields included in the field FR, and specifically, a plurality of periods divided from the field FR are the plurality of subfields. In FIG. 6, SF1 to SF16 correspond to the plurality of subfields. Furthermore, the plurality of scan lines are scan lines for constituting the scan line selection order pattern, and the number of scan lines is not limited to the number of scan lines actually present in the electro-optical element. In FIG. 6, the first to the 16th scan lines correspond to the plurality of scan lines. At this time, the number of scan lines actually present in the electro-optical element may be less than 16. For example, when the number of scan line actually present in the electro-optical element is 14, there is a selection order pattern of the first to 16 scan lines as internal processing of the circuit device 100, but the 15th scan line and the 16th scan lines are not actually driven. Furthermore, selection of a scan line group once in a subfield is selection of one scan line belonging to a scan line group once in the subfield. At this time, one scan line is selected in the same selection order, and two or more scan lines are not selected at the same time. In addition, the scan line connected to the pixel circuit to which the i-th bit is written in the subfield, and the scan line connected to the pixel circuit to which the j-th bit is written in the subfield are different scan lines. The same bit of the first to n-th bits is written to a plurality of pixel circuits connected to one scan line in a certain subfield.

In addition, in the present exemplary embodiment, the scan line drive circuit 110 selects each scan line n times in the field FR, thus the first to n-th bits of display data are written to each pixel circuit. Specifically, when the scan line drive circuit 110 selects a scan line n times, in each of the selections, the data line drive circuit 120 writes one of the first to n-th bits to a pixel circuit connected to the selected scan line. At this time, the data line drive circuit 120 writes the first to the n-th bits so as not to overlap in the n selections. In FIG. 6, for example, the first scan line is selected four times in the selection orders 1, 6, 15, and 32, and the first, second, third, and fourth bits are written, respectively.

As described above, focusing on one scan line, the first to n-th scan line selection periods and the first to n-th display periods are required in one field. According to the present exemplary embodiment, each scan line is selected n times, and the first to n-th bits are written to the scan line, and thus the first to n-th scan line selection periods and the first to n-th display periods are realized for all the scan lines in one field.

In addition, in the present exemplary embodiment, each subfield of the plurality of subfields is a period of the same length. In addition, in the present exemplary embodiment, the scan line group includes the n scan lines from the scan line connected to the pixel circuit to which the first bit is written in the subfield, to the scan line connected to the pixel circuit to which the n-th bit is written in the subfield.

The fact that each subfield is the period of the same length is that the number of scan lines of the selected scan line group is the same in each subfield. Then, the same number of scan lines as the number of bits of the display data are selected for each subfield to make one round, and thus the first to n-th bits are written to all of the scan lines. In FIG. 6, the four scan lines are selected in each subfield, and the pattern is shifted by one scan line for each subfield, one round is made by the 16 subfields, and the first to fourth bits are written to the 16 scan lines.

Note that in FIG. 6, the length of the subfield is (the number of bits of display data)×h=4 h, but the length of the subfield is not limited thereto, and varies depending on a way of constituting a selection order pattern. An example in which the length of the subfield is not the number of bits of display data will be described later.

Further, as illustrated in FIG. 4, the pixel 31 is the light emitting element. The pixel circuit 32 includes the memory circuit 33. In the first to n-th scan line selection periods, the first to n-th bits are written to the memory circuit 33. The first to n-th bits written to the memory circuit 33 does or does not cause the light emitting element to emit light in the first to n-th display periods.

In this way, the light emitting element is used as the pixel 31, and the emission or non-emission of light of the light emitting element is controlled in accordance with the first to n-th bits of display data, and thus the grey-scale display is enabled. Furthermore, by storing the first to n-th bits of the display data in the memory circuit 33, power consumption at the time of writing can be reduced compared to a case where the image signal DT is held by the capacitor.

4. Second Example, Third Example of Scan Line Selection Order

In the first example, the number of scan lines is $2^n$ for the n-bit display data, but in second and third and examples, the number of scan lines is $2\times2^n$ for the n-bit display data. Note that, an example will be described here in which the number of scan lines is doubled, but the number can be three times or greater in a similar manner.

Figure 7:
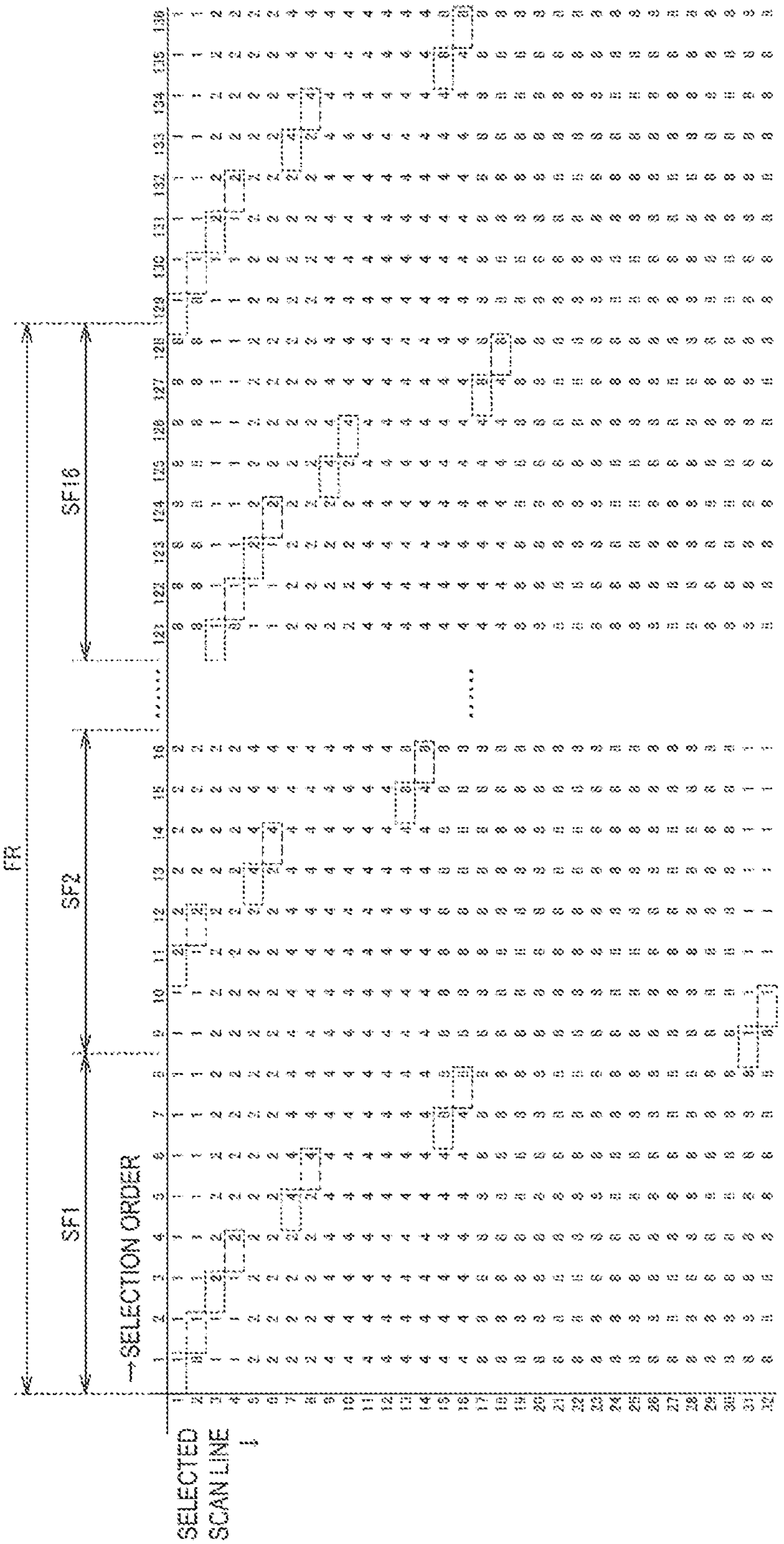
FIG. 7 is a second example of the scan line selection order.
Figure 8:
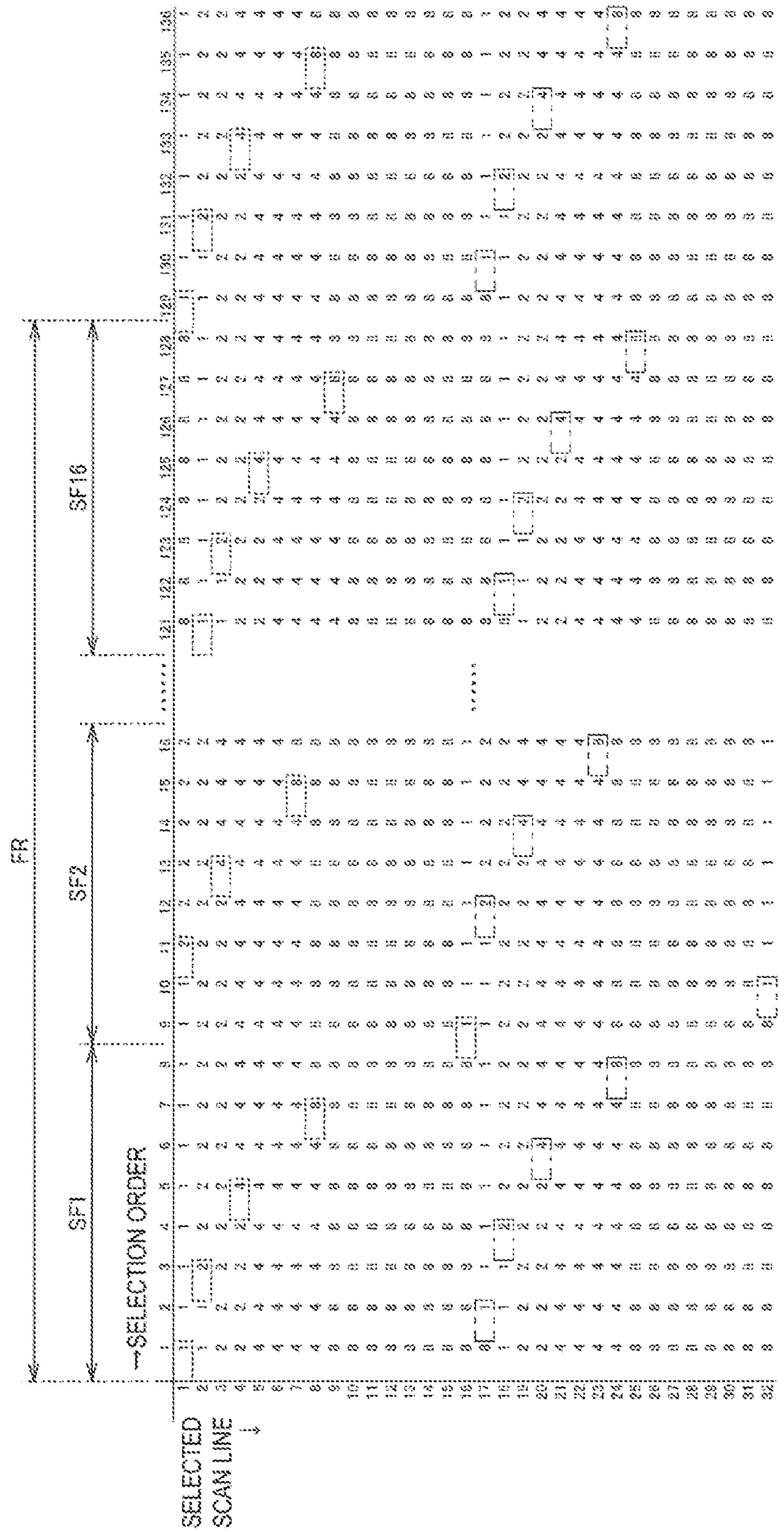
FIG. 8 is a third example of the scan line selection order.

FIG. 7 is the second example of the scan line selection order, and FIG. 8 is the third example of the scan line selection order. Similar to the first example, the field FR includes the subfields SF1 to SF16. In the second example and the third example, a length of one subfield is 8 h, and is twice the length 4 h of the one subfield in the first example. In addition, in one subfield, each bit of display data is written to two scan lines.

In the second example of FIG. 7, each of an odd-th scan line and an even-th scan line have a selection order pattern similar to that in the first example in FIG. 6, an odd-th scan line is selected in an odd-th selection order, and an even-th scan line is selected in an even-th selection order. Taking the subfield SF1 as an example, a first scan line, a third scan line, a seventh scan line, and a 15th scan line are selected in selection orders 1, 3, 5, and 7, respectively, and a second scan line, a fourth scan line, an eighth scan line, and a 16th scan line are selected in selection orders 2, 4, 6, and 8, respectively. A first bit is written to the first scan line and the second scan line, a second bit is written to the third scan line and the fourth scan line, a third bit is written to the seventh scan line and the eighth scan line, and a fourth bit is written to the 15th scan line and the 16th scan line. This selection order pattern is shifted upward by two scan lines for each field, and one round is made with the subfields SF1 to SF16.

In the third example of FIG. 8, each of first to 16th scan lines and 17th to 32nd scan lines have a selection order pattern similar to that in the first example in FIG. 6, each of the first to 16th scan lines is selected in an odd-th selection order, and each of the 17th to 32nd scan line is selected in an even-th selection order. Taking the subfield SF1 as an example, the first scan line, the second scan line, the fourth scan line, and the eighth scan line are selected in selection orders 1, 3, 5, and 7, respectively, and the 17th scan line, the 18th scan line, the 20th scan line, and the 24th scan line are selected in selection orders 2, 4, 6, and 8, respectively. A first bit is written to the first scan line and the 17th scan line, a second bit is written to the second scan line and the 18th scan line, a third bit is written to the fourth scan line and the 20th scan line, and a fourth bit is written to the eighth scan line and the 24th scan line. This selection order pattern is shifted upward by one scan line for each field, and one round is made with the subfields SF1 to SF16.

In the second example and the third example, the total number of scan line selections in one field is $2\times2^n\times n$ for n-bit display data. That is, the total number is twice the total number of scan line selections in the first example.

5. Fourth Example of Scan Line Selection Order

Figure 9:
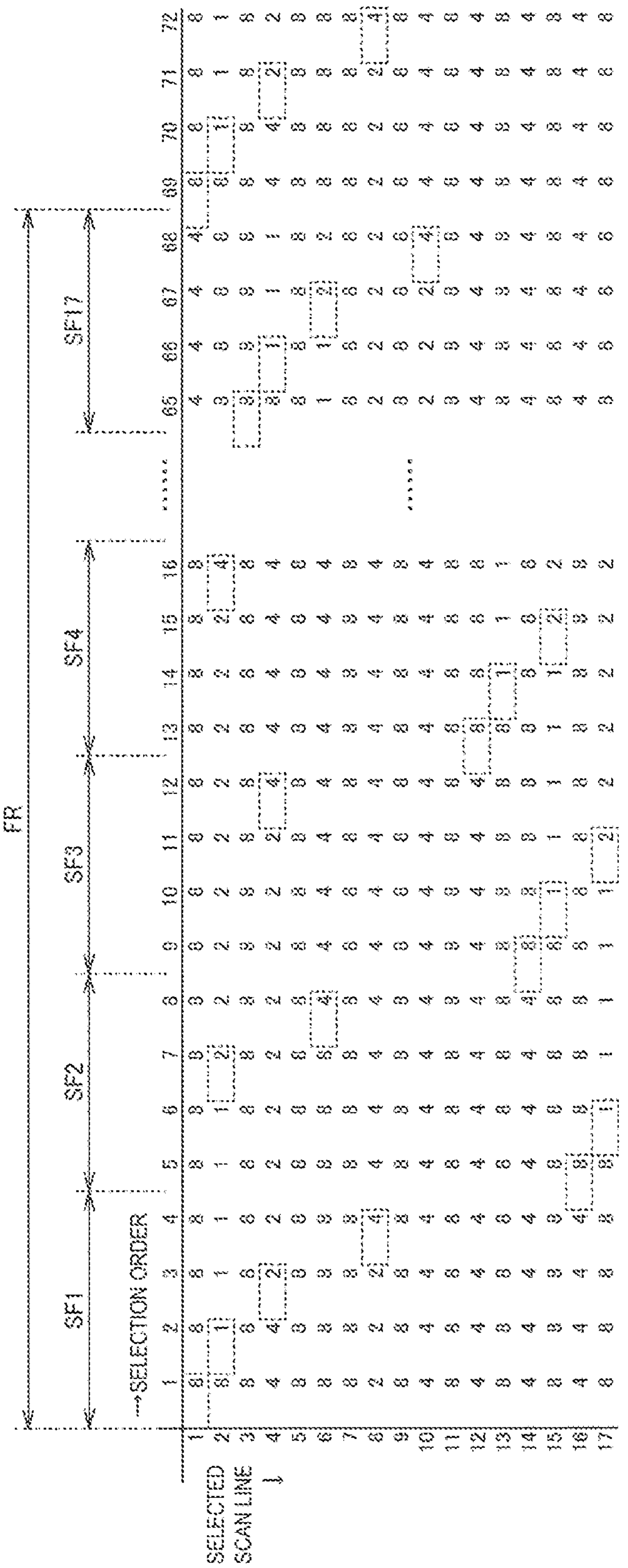
FIG. 9 is a fourth example of the scan line selection order.

FIG. 9 is a fourth example of the scan line selection order. In the first to third examples, $2^n$ or an integer multiple thereof scan lines are driven for the n-bit display data, but in the fourth example, $J\neq2^n$ scan lines are driven. Note that, by combining the fourth example with the second example or the third example, it is possible to drive an integer multiple of J scan lines.

In FIG. 9, an example of selecting $J=2^4+1=17$ scan lines will be described. Note that, j may be an integer such that the greatest common divisor of the number of bits n of the display data and j is 1. In other words, the lowest common multiple of j and the number of bits n of the display data may be j×n.

In the fourth example as well, similar to the first example, a length of one subfield is 4 h, four scan lines are selected in one subfield, and first to fourth bits are written to the four scan lines, one bit at a time. However, in the fourth example, the bit written to the scan line is different from the first example. Furthermore, the field FR includes J=17 subfields SF1 to SF17.

Taking the subfield SF1 as an example, the fourth bit, the first bit, the second bit and the third bit are written to a first scan line, a second scan line, a fourth scan line and an eighth scan line, respectively. This selection order pattern is shifted upward by two scan lines for each subfield. Then, the subfields SF1 to SF17 make one round, each scan line is selected n times, and the first to an n-th bits are written to each scan line. Therefore, the total number of scan line selections in one field is j×n.

Expressing as $J=2^n+\alpha$, this selection order pattern is shifted upward by α+1 scan line for each subfield. In FIG. 9, α=1, thus the selection order pattern is shifted by two scan lines for each subfield. For example, in the subfield SF1, the second scan line to which the first bit is written and the fourth scan line to which the second bit is written are separated by two scan lines. Since this is shifted upward by two scan lines in the subfield SF2, a first display period of the second scan line is 1×4 h=4 h. Similarly, the fourth scan line to which the second bit is written and the eighth scan line to which the third bit is written are separated by four lines, and thus a second display period is 2×4 h=8 h. In this way, a display period proportional to a grey-scale value of a bit of display data is obtained. Which bit may be written in which scan line varies depending on a value of α, but can be determined by the concept as described above.

In the present exemplary embodiment, when the number of scan lines of an electro-optical element is k, the number of dummy scan lines is p, and J=k+p, J is a number that is greater than k and for which the lowest common multiple with n is J×n. The scan line drive circuit 110 performs J×n scan line selections in the field FR, selects k scan lines LSC1 to SCk of the electro-optical element in k×n scan line selections among the J×n scan line selections, and selects p dummy scan lines in p×n scan line selections as internal processing.

Here, a dummy scan line number is a scan line that is present in a selection order pattern as internal processing of the scan line drive circuit 110, but is not present as a scan line of the electro-optical element, and is not an actual drive object.

For example, when display data contains four bits and the number of scan lines of an electro-optical element is 20, 16 in the first example is insufficient, thus is doubled to 32 in the second example or the third example. At this time, because 12 dummy scan lines are generated, the dummy scan lines will be selected 12×4=48 times among the total number of scan line selections 32×4=128. In other words, non-scanning periods for the 48 selections are generated. On the other hand, in the fourth example, by setting k=20 and p=1, a selection order pattern can be constituted with J=21 scan lines. In this case, the total number of scan lines is 21×4=84, and among that, the number of selections of the dummy scan lines is 1×4=4.

Thus, in the fourth example compared to the first to third examples, the number of scan lines J in a drive order pattern can be set to a minimum in accordance with the number of scan lines of the electro-optical element. As a result, the number of selections of the dummy scan lines can be reduced, and as a result, the number of total scan line selections in one frame can be reduced. As a result, the scan line drive frequency can be lowered compared to the first to third examples, allowing for further low power consumption or reliable writing of data to the pixel circuit.

6. Fifth Example, Sixth Example of Scan Line Selection Order

In the first to fourth examples, when focusing on one scan line, the first to n-th bits are sequentially written, that is, the first to n-th scan line selection periods are sequentially aligned. In fifth and sixth examples, a writing order of first to n-th bits is set so that long display periods corresponding to bits having large grey-scale values are not continuous.

Figure 10:
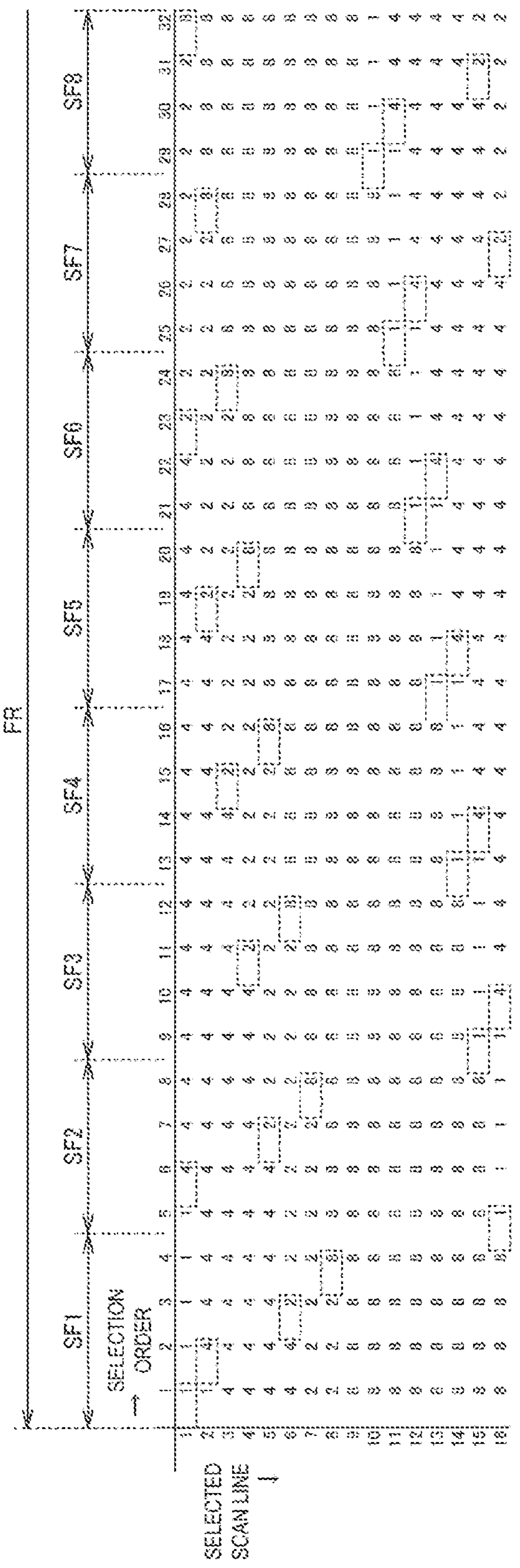
FIG. 10 is a fifth example of the scan line selection order.

FIG. 10 is the fifth example of the scan line selection order. Focusing on one scan line, a first bit, a third bit, a second bit, and a fourth bit are written in that order. Thus, a first display period, a third display period, a second display period, and a fourth display period are aligned in that order, and respective lengths thereof are aligned as 4 h, 16 h, 8 h, and 32 h respectively. Since 4 h and 8 h are inserted between the long display periods 16 h and 32 h, the long display periods are not adjacent.

When the long display periods 16 h and 32 h are adjacent, and a pixel is ON-state in both of the display periods, or when a pixel is OFF-state in both of the display periods, a state may continue where the pixel is ON-state or OFF-state for an extended period of time in a frame. In such a case, it may appear flickering when viewing an image appearing on a screen. According to the present exemplary embodiment, 16 h and 32 h, which are the long display periods, are not adjacent, thus it is possible to reduce flickering of an image.

Note that, the order of writing bits may be changed as appropriate in accordance with the number of bits of display data and the like. For example, when display data contains six bits, a writing order may be set to, for example, a first bit, a fourth bit, a second bit, a fifth bit, a third bit, and a sixth bit.

Figure 11:
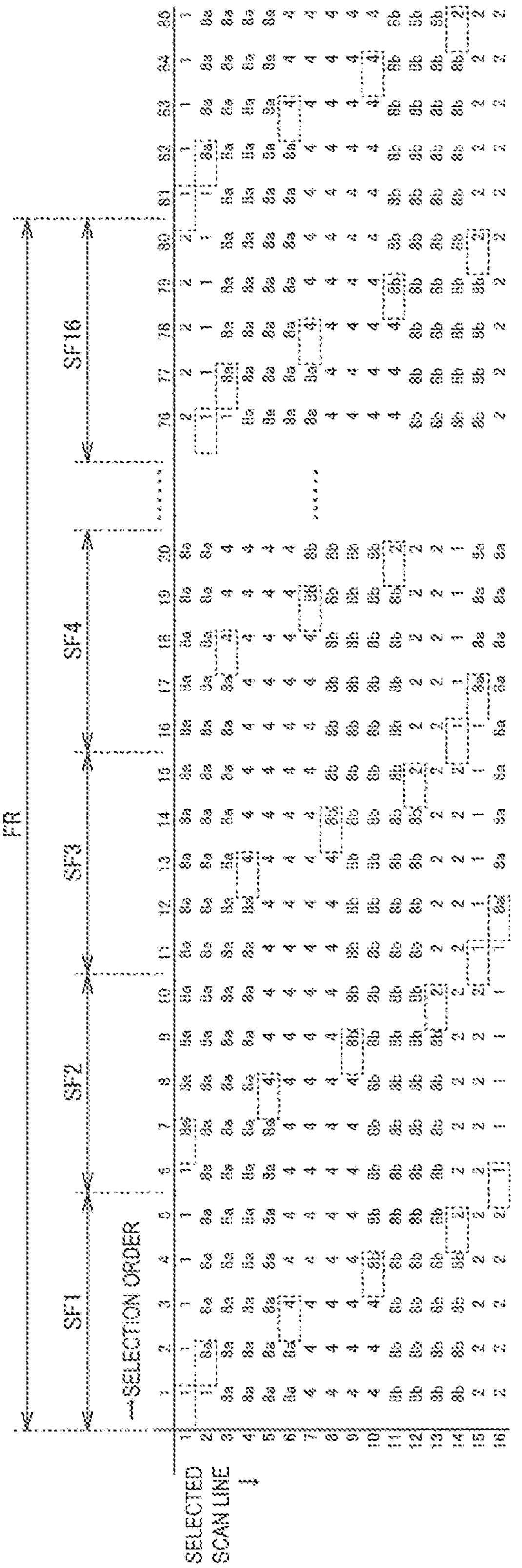
FIG. 11 is a sixth example of the scan line selection order.

FIG. 11 is the sixth example of the scan line selection order. In the sixth example, a long display period corresponding to a higher bit is divided into a plurality of display periods, and display periods corresponding to other bits are inserted therebetween. FIG. 11 illustrates an example in which a fourth display period corresponding to, among first to fourth bits, the fourth bit is divided into two, that is, a first fourth display period and a second fourth display period.

In FIG. 11, each of 8*a* and 8*b* in a box of a table refers to the fourth bit, and 8*a* is illustrated in correspondence with the first fourth display period, and 8*b* is illustrated in correspondence with the second fourth display period. A total length of the fourth display periods is 40 h, and a length of each of the first fourth display period and the second fourth display period is 20 h.

Focusing on one scan line, a first bit, a fourth bit, a third bit, a fourth bit, and a second bit are written in that order. A third display period is inserted between the first fourth display period and the second fourth display period. Lengths of the respective display periods are aligned as 5 h, 20 h, 20 h, 20 h, and 10 h.

In FIG. 11, the fourth bit is written twice to one scan line, so five scan line selections are required in one subfield. For example, in the subfield SF1, a first scan line, a second scan line, a sixth scan line, a 10th scan line, and a 14th scan line are selected in selection orders 1, 2, 3, 4, and 5, respectively, and the first bit, the fourth bit, the third bit, the fourth bit, and the second bit are written. The number of scan lines is $2^4$=16 for 4-bit display data, and is the same as in the first example. Also same as the first example, the selection order pattern is shifted upward by one scan line for each subfield. The total number of scan line selections in one field is $2^4$×5=80.

According to the present exemplary embodiment, a scan line group selected in the subfield includes n−1 scan lines and two or more scan lines. The n−1 scan lines are n−1 scan lines from a scan line connected to a pixel circuit to which the first bit is written in the subfield to a scan line connected to a pixel circuit to which an (n−1)-th bit is written in the subfield. The two or more scan lines are two or more scan lines connected to two or more pixel circuits to which an n-th bit, which is a higher bit of display data in the subfield, is written. In the subfield SF1 of FIG. 11, the n−1 scan lines are the first scan line, the sixth scan line, and the 14th scan line, and the two or more scan lines are the second scan line and the 10th scan line.

In this way, in the subfield, the n-th bit, which is the higher bit of the display data, is written to the two or more scan lines, and thus, an n-th display period, which is longer than a display period corresponding to a lower bit, can be divided into two or more.

In addition, in the present exemplary embodiment, the n-th display period corresponding to the n-th bit includes a first n-th display period and a second n-th display period. At least one display period of the first to (n−1)-th display periods is provided between the first n-th display period and the second n-th display period.

In this way, at least one display period of the first to (n−1)-th display periods that is shorter than the n-th display period can be inserted between the first n-th display period and the second n-th display period. This reduces the likelihood that a pixel may be ON-state or OFF-state for a long period of time, and flickering of an image displayed on a screen can be reduced.

7. Electro-Optical Element, Electronic Apparatus

Figure 12:
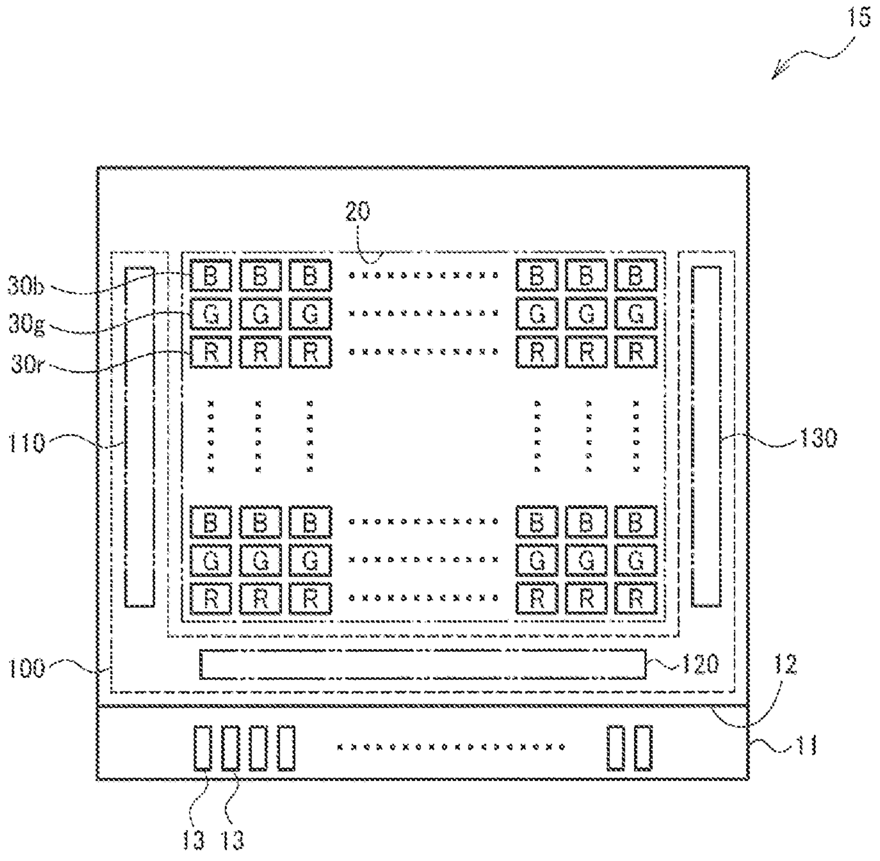
FIG. 12 is a configuration example of an electro-optical element.

FIG. 12 is a configuration example of an electro-optical element 15 including the circuit device 100. The electro-optical element 15 is also referred to as a display element, an electro-optical panel, a display panel, an electro-optical device, or a display device. Here, a case will be described as an example in which the electro-optical element is an organic EL display element, but the electro-optical element is not limited thereto, and the electro-optical element may be, for example, a micro LED display element, a quantum dot display element, a DMD display element, or the like.

The electro-optical element 15 includes an element substrate 11, a protective substrate 12, terminals 13, the pixel array 20, and the circuit device 100.

The element substrate 11 is a semiconductor substrate such as silicon substrate or the like, for example. The pixel array 20 includes pixel portions 30*b*, 30*g*, and 30*r* arranged in a matrix, and the pixel portions 30*b*, 30*g*, and 30*r* are formed at the element substrate 11. A blue color filter is provided in a light emitting element of the pixel portion 30*b*, a green color filter is provided in a light emitting element of the pixel portion 30*g*, and a red color filter is provided in a light emitting element of the pixel portion 30*r*.

The circuit device 100 is constituted by an integrated circuit formed at the element substrate 11. The circuit device 100 includes the scan line drive circuit 110, the data line drive circuit 120, and the enable line drive circuit 130. The circuit device 100 and the terminals 13 are connected by wiring (not illustrated) formed at the element substrate 11. The terminals 13 are connected to the display controller 60 in FIG. 3, and display data and a control signal from the display controller 60 are inputted to the circuit device 100 via the terminals 13.

The protective substrate 12 is arranged covering the element substrate 11 except for an arrangement portion of the terminals 13. The protective substrate 12 is provided to protect the pixel array 20 and the circuit device 100 formed at the element substrate 11. The protective substrate 12 is a light transmissive substrate such as, for example, a glass substrate.

Figure 13:
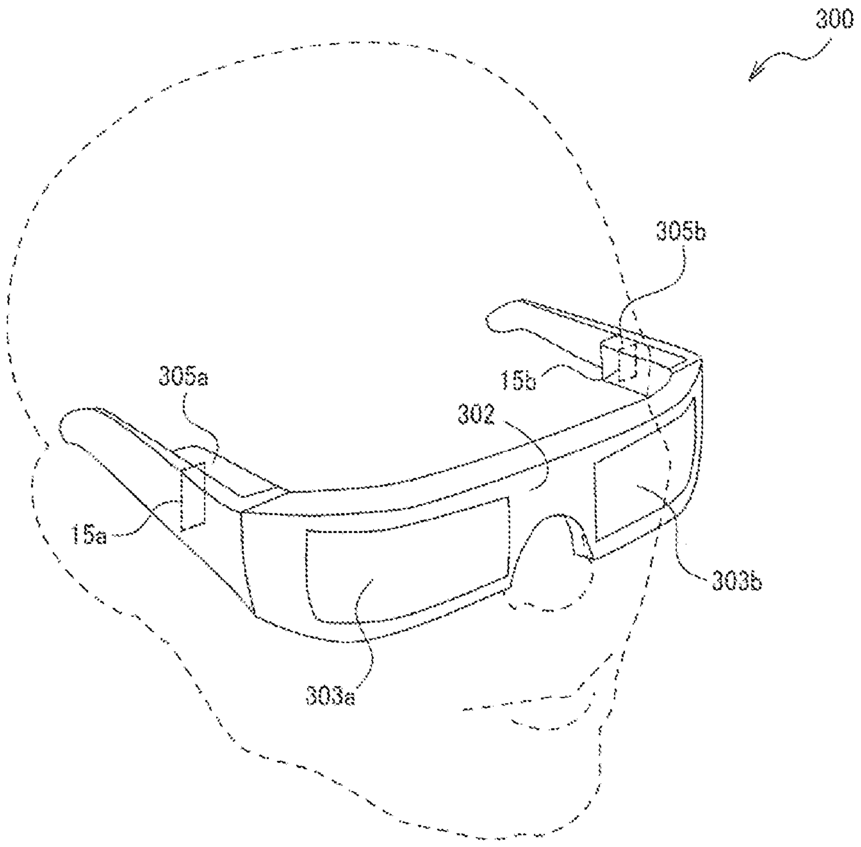
FIG. 13 is a configuration example of an electronic apparatus.

FIG. 13 is a configuration example of an electronic apparatus 300 including electro-optical elements 15*a* and 15*b*. Here, a case in which the electronic apparatus is a head-mounted display will be described as an example, but the electronic apparatus is not limited thereto, and various devices each displaying an image using an electro-optical element can be assumed as the electronic apparatus. For example, the electronic apparatus may be an electronic viewfinder, a projector, a head-up display, a personal digital assistant, a television device, an on-board display, or the like.

The head-mounted display has an eyeglass-like appearance, and allows a user wearing the head-mounted display to visually recognize image light overlaid on external light. The electronic apparatus 300, which is the head-mounted display, includes transparent members 303*a*, 303*b*, a frame 302, projection devices 305*a* and 305*b*.

The frame 302 supports the transparent members 303*a*, 303*b*, the projection devices 305*a* and 305*b*. The frame 302 is mounted to a head of the user so that the head-mounted display is mounted to the head of the user. The transparent member 303*a* is provided at a right eye portion of the frame 302, and the transparent member 303*b* is provided at a left eye portion of the frame 302. The transparent members 303*a* and 303*b* transmit external light, thereby allowing the user to visually recognize external light. The projection device 305*a* is provided at from a right temple portion of the frame 302 to the right eye portion, and the projection device 305*b* is provided at from a left temple portion to the left eye portion of the frame 302. The projection devices 305*a* and 305*b* cause image light to be incident on the eyes of the user, thereby allowing the user to visually recognize image light overlaid on external light.

The projection device 305*a* includes the electro-optical element 15*a*. As illustrated in FIG. 12, the electro-optical element 15*a* includes the circuit device 100 and the pixel array 20. The projection device 305*a* includes an optical system (not illustrated) that causes an image displayed on the pixel array 20 to be incident on the eyes of the user. The optical system includes, for example, a lens and a light-guiding member that reflects image light on an interior surface. A configuration is adopted in which image light is formed by refraction by the lens, and a curvature of a reflective surface of the light-guiding member. Similarly, the projection device 305*b* includes the electro-optical element 15*b* and an optical system (not illustrated).

The circuit device according to the present exemplary embodiment described above includes the scan line drive circuit. The scan line drive circuit drives the plurality of scan lines of the electro-optical element. The electro-optical element includes the plurality of scan lines, the plurality of pixels, and the plurality of pixel circuits. A field for constituting a single image includes first to n-th scan line selection periods and first to n-th display periods. During the first to n-th scan line selection periods, first to n-th bits of display data (n is an integer of 2 or greater) are written to pixel circuits included in the plurality of pixel circuits. In the first to n-th display periods, a pixel of the plurality of pixels connected to the pixel circuit is ON-state or OFF-state based on the first to n-th bits written to the pixel circuit. The field includes a plurality of subfields. The scan line drive circuit selects once a scan line group to be selected among the plurality of scan lines, in a subfield included in the plurality of subfields. The scan line group includes a scan line connected to a pixel circuit to which an i-th bit (i is an integer from 1 to n) of first to n-th bits of display data is written in a subfield, and a scan line connected to a pixel circuit to which a j-th bit (j is an integer from 1 to n and different from i) of the first to n-th bits of the display data is written in the subfield.

According to the present exemplary embodiment, the i-th bit is written to one scan line in one subfield, and the j-th bit is written to another scan line. As a result, the non-scanning periods in which no scan line is selected can be reduced, and the scan line drive frequency can be lowered compared to the technique in the past.

Further, in the present exemplary embodiment, in a field, first to n-th bits of display data may be written to each pixel circuit of the plurality of pixel circuits, by the scan line drive circuit selecting each scan line of the plurality of scan lines n times.

Focusing on one scan line, first to n-th scan line selection periods and first to n-th display periods are required in one field. According to the present exemplary embodiment, each scan line is selected n times, and the first to n-th bits are written to the scan line, and thus the first to n-th scan line selection periods and the first to n-th display periods are realized for all the scan lines in one field.

In addition, in the present exemplary embodiment, each subfield of the plurality of subfields may be a period of the same length.

In addition, in the present exemplary embodiment, the scan line group may include n scan lines from a scan line connected to a pixel circuit to which a first bit is written in a subfield to a scan line connected to a pixel circuit to which an n-th bit is written in the subfield.

The fact that each subfield is a period of the same length is that the number of scan lines of a selected scan line group is the same in each subfield. Then, a selection order pattern is constituted such that the scan line group includes n scan lines from a scan line connected to a pixel circuit to which a first bit is written, to a scan line connected to a pixel circuit to which an n-th bit is written. By constituting such a selection order pattern, the first to n-th bits can be written to the pixel connected to each scan line in one field, and periods in which no scanning is selected can be reduced.

In addition, in the present exemplary embodiment, a scan line group may include, n−1 scan lines from a scan line connected to a pixel circuit to which a first bit is written in a subfield, to a scan line connected to a pixel circuit to which an (n−1)-th bit of first to n-th bits of display data is written in the subfield, and two or more scan lines connected to two or more pixel circuits to which the n-th bit, which is a higher bit of display data, is written in the subfield.

According to the present exemplary embodiment, in the subfield, the n-th bit, which is the higher bit of the display data, is written to the two or more scan lines, and thus, an n-th display period, which is longer than a display period corresponding to a lower bit, can be divided into two or more.

In addition, in the present exemplary embodiment, an n-th display period corresponding to an n-th bit may include a first n-th display period and a second n-th display period. At least one display period of first to (n−1)-th display periods may be provided between the first n-th display period and the second n-th display period.

According to the present exemplary embodiment, at least one display period of the first to (n−1)-th display periods, that is shorter than the n-th display period can be inserted between the first n-th display period and the second n-th display period. This reduces the likelihood that a pixel may be ON-state or OFF-state for a long period of time, and flickering of an image displayed on a screen can be reduced.

In addition, in the present exemplary embodiment, when the number of scan lines of an electro-optical element is k, the number of dummy scan lines is p, and J=k+p, J may be a number that is greater than k and for which the lowest common multiple with n is J×n. The scan line drive circuit may perform J×n scan line selections in a field, select k scan lines of the electro-optical element in k×n scan line selections among the J×n scan line selections, and select p dummy scan lines in p×n scan line selections as internal processing.

According to the present exemplary embodiment, the number of scan lines J included in a drive order pattern can be set to a number that is not an integer multiple of $2^n$. Accordingly, the number of scan lines J in the drive order pattern can be set to a minimum in accordance with the number of scan lines of the electro-optical element. As a result, the number of selections of the dummy scan lines can be reduced, and as a result, the number of total scan line selections in one frame can be reduced.

Further, in the present exemplary embodiment, the pixel may be a light emitting element. The pixel circuit may include a memory circuit. In first to n-th scan line selection periods, first to n-th bits may be written to the memory circuit. In first to n-th display periods, the light emitting element may or may not emit light based on the first to n-th bits written to the memory circuit.

According to the present exemplary embodiment, the light emitting element is used as the pixel, and the emission or non-emission of light of the light emitting element is controlled in accordance with the first to n-th bits of display data, and thus grey-scale display is enabled. Furthermore, by storing the first to n-th bits of the display data in the memory circuit, power consumption at the time of writing can be reduced compared to a case where an image signal is held by a capacitor.

Additionally, the electro-optical element according to the present exemplary embodiment includes the circuit device described in any of the above, the plurality of scan lines, the plurality of pixels, and the plurality of pixel circuits.

In addition, the electro-optical element according to the present exemplary embodiment includes the plurality of scan lines, the data line, the plurality of pixel portions arranged corresponding to the respective intersections of the plurality of scan lines and the data line, and the scan line drive circuit configured to drive the plurality of scan lines. Each pixel portion of the plurality of pixel portions includes the pixel circuit configured to hold display data constituted by first to n-th bits (n is an integer of 2 or greater) bit by bit in a predetermined order, and the pixel that is ON-state or OFF-state based on the held display data. The scan line drive circuit selects once a scan line group to be selected among the plurality of scan lines, in each subfield included in a plurality of subfields. The scan line group, in a subfield, includes a scan line corresponding to a pixel circuit to which display data of an i-th bit (i is an integer from 1 to n) is supplied, and a scan line corresponding to a pixel circuit to which display data of a j-th bit (j is an integer from 1 to n and different from i) is supplied.

Further, in the electro-optical element according to the present exemplary embodiment, in a plurality of subfields, the scan line drive circuit may select each scan line of the plurality of scan lines n times, and thus display data corresponding to each of the bits of first to n-th bits of the display data may be held in the pixel circuit.

In addition, in the electro-optical element according to the present exemplary embodiment, each subfield of a plurality of subfields may be a period of the same length.

In addition, in the electro-optical element according to the present exemplary embodiment, the pixel circuit may include a memory circuit. The pixel may include a light emitting element that does or does not emit light based on display data held in the memory circuit.

Further, the electronic apparatus according to the present exemplary embodiment includes the circuit device described in any of the above, and the electro-optical element.

Further, the electronic apparatus according to the present exemplary embodiment includes the electro-optical element described in any of the above.

Although the present exemplary embodiment has been described in detail above, those skilled in the art will easily understand that many modified examples can be made without substantially departing from novel items and effects of the present disclosure. All such modified examples are thus included in the scope of the disclosure. For example, terms in the descriptions or drawings given even once along with different terms having identical or broader meanings can be replaced with those different terms in all parts of the descriptions or drawings. All combinations of the embodiment and modified examples are also included within the scope of the disclosure. Furthermore, the configurations, operations, and the like of the circuit device, the pixel circuit, the pixel, the electro-optical element, and the electronic apparatus are not limited to those described in the present exemplary embodiment, and various modifications thereof are possible.

What is claimed is:

1. A circuit device used for an electro-optical element including a plurality of scan lines, a plurality of pixel circuits respectively corresponding to one of the plurality of scan lines, the electro-optical element displaying a single image in a field, comprising:

a scan line drive circuit configured to output a plurality of selection signals respectively corresponding to the plurality of scan lines, wherein the field includes first to n-th scan line selection periods in which first to n-th display data are supplied to a pixel circuit included in the plurality of pixel circuits, n being an integer of 2 or greater, the field includes a plurality of subfields, the scan line drive circuit, in a subfield included in the plurality of subfields, selects once a scan line group to be selected among the plurality of scan lines, the scan line group includes a first scan line and a second scan line, and an i-th display data of the first to n-th display data is supplied to the first scan line in the subfield, i is an integer from 1 to n, a j-th display data of the first to n-th display data is supplied to the second scan line in the subfield, and j is an integer from 1 to n and different from i.

2. The circuit device according to claim 1, wherein in the field, the scan line drive circuit selects each scan line of the plurality of scan lines n times, and thus the first to n-th the display data are supplied to each pixel circuit of the plurality of pixel circuits.

3. The circuit device according to claim 1, wherein each subfield of the plurality of subfields is a period of the same length.

4. The circuit device according to claim 1, wherein the scan line group includes n scan lines from a first scan line which supplies the first display data in the subfield, to a n-th scan line which supplies the n-th display data in the subfield.

5. The circuit device according to claim 1, wherein the field further includes first to n-th display periods, a length of k-th display period is different from a length of 1-th display period, k is an integer from 1 to n, 1 is an integer from 1 to n and different from k.

6. The circuit device according to claim 5, wherein the field includes first to n-th display periods, a length of m-th display period is twice a length of (m−1)-th display period, m is an integer from 2 to n.

7. The circuit device according to claim 1, wherein an electro-optical element includes a first pixel corresponding to the first scan line and a second pixel corresponding to the second scan line, the first pixel displays according to the i-th display data in an i-th display period and the second pixel displays according to the j-th display data in a j-th display period, and a first length of the first display period is different from a second length of the second display period.

8. The circuit device according to claim 7, wherein a length of the second display period is twice a length of the first display period.

9. An electronic apparatus, comprising:

the circuit device according to claim 1; and the electro-optical element.

10. An electro-optical element, comprising:

a plurality of scan lines;

a data line;

a plurality of pixel portions arranged corresponding to respective intersections of the plurality of scan lines and the data line; and a scan line drive circuit configured to drive the plurality of scan lines, wherein each of the pixel portions includes a pixel circuit that holds first to n-th display data and displays according to the first to n-th display data in a predetermined order, n is an integer of 2 or greater, a single image is displayed in a field that includes a plurality of subfields, in each of the subfield, the scan line drive circuit selects once a scan line group from the plurality of scan lines, and the scan line group includes:

a first scan line corresponding to the pixel circuit to which an i-th display data is supplied, i is an integer from 1 to n, and a second scan line corresponding to the pixel circuit to which a j-th display data is supplied, j is an integer from 1 to n and different from i.

11. The electro-optical element according to claim 10, wherein in the plurality of subfields, the scan line drive circuit selects each scan line of the plurality of scan lines n times, and thus the first to n-th display data is held in the pixel circuit.

12. The electro-optical element according to claim 10, wherein each subfield of the plurality of subfields is a period of the same length.

13. The electro-optical element according to claim 10, wherein the pixel circuit includes a memory circuit, and the pixel includes a light emitting element that emits light based on the display data held in the memory circuit.

14. An electronic apparatus, comprising:

the electro-optical element according to claim 10.

* * * * *